United States Patent
Yamada et al.

(10) Patent No.: US 7,067,236 B2
(45) Date of Patent: Jun. 27, 2006

(54) METHOD OF MANUFACTURING MEMBER PATTERN, METHOD OF MANUFACTURING WIRING STRUCTURE, METHOD OF MANUFACTURING ELECTRON SOURCE, AND METHOD OF MANUFACTURING IMAGE DISPLAY DEVICE

(75) Inventors: Shuji Yamada, Kanagawa (JP); Takahiro Hachisu, Kanagawa (JP); Tadayasu Meguro, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 383 days.

(21) Appl. No.: 10/619,575

(22) Filed: Jul. 16, 2003

(65) Prior Publication Data
US 2004/0018449 A1    Jan. 29, 2004

(30) Foreign Application Priority Data
Jul. 19, 2002    (JP) ............................. 2002-210487

(51) Int. Cl.
*G03C 5/00*    (2006.01)
(52) U.S. Cl. ...................... 430/312; 430/311; 430/319; 430/325; 430/328; 430/330
(58) Field of Classification Search ................ 430/311, 430/312, 319, 325, 328, 330
See application file for complete search history.

(56) References Cited

U.S. PATENT DOCUMENTS

| 5,578,403 | A | * | 11/1996 | Watanabe et al. ............... 430/7 |
| 5,839,363 | A | | 11/1998 | Yanagisawa et al. ........ 101/123 |
| 6,179,678 | B1 | | 1/2001 | Kishi et al. .................... 445/24 |
| 6,426,733 | B1 | | 7/2002 | Yamada ..................... 345/74.1 |
| 2002/0003398 | A1 | | 1/2002 | Meguro et al. ............. 313/495 |
| 2002/0008454 | A1 | | 1/2002 | Ishiwata et al. ............ 313/310 |
| 2002/0070677 | A1 | | 6/2002 | Yamada et al. .......... 315/169.4 |
| 2003/0057816 | A1 | | 3/2003 | Yamada et al. ............. 313/311 |

FOREIGN PATENT DOCUMENTS

| JP | 8-34110 | 2/1996 |
| JP | 8-321254 | 12/1996 |
| JP | 9-306341 | 11/1997 |
| KR | 2000-0056892 | 9/2000 |

* cited by examiner

*Primary Examiner*—Christopher G. Young
(74) *Attorney, Agent, or Firm*—Fitzpatrick, Cella, Harper & Scinto

(57) ABSTRACT

The present invention provides a method of manufacturing a member pattern having a patterned member on a substrate, the method including: a first exposure step of exposing a desired region of a negative type photosensitive material applied to the substrate to light from a first direction; a second exposure step of exposing the desired region of the negative type photosensitive material to light from a second direction opposite to the first direction; a development step of performing development after the exposure steps to form a precursor pattern of the member; and a step of baking the precursor pattern.

25 Claims, 14 Drawing Sheets

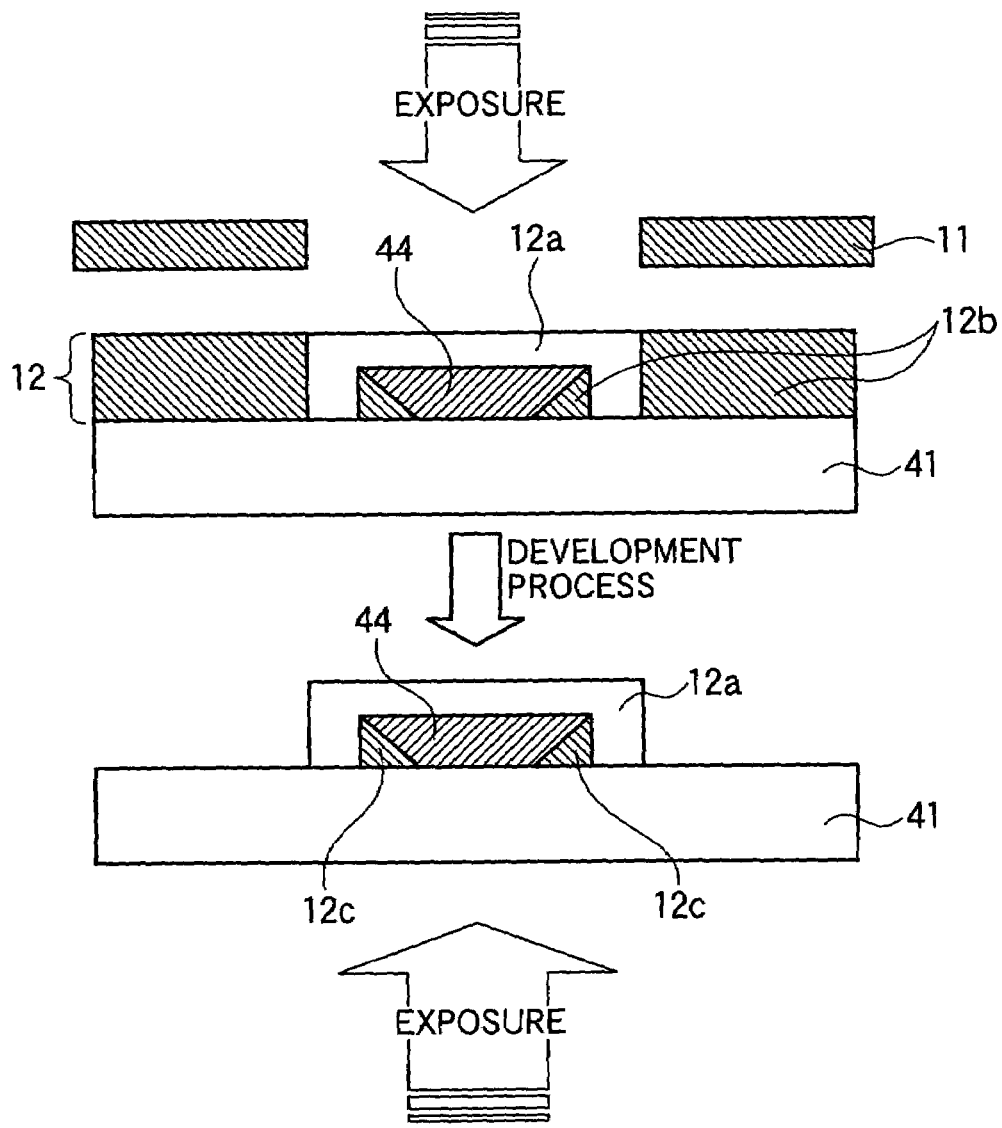

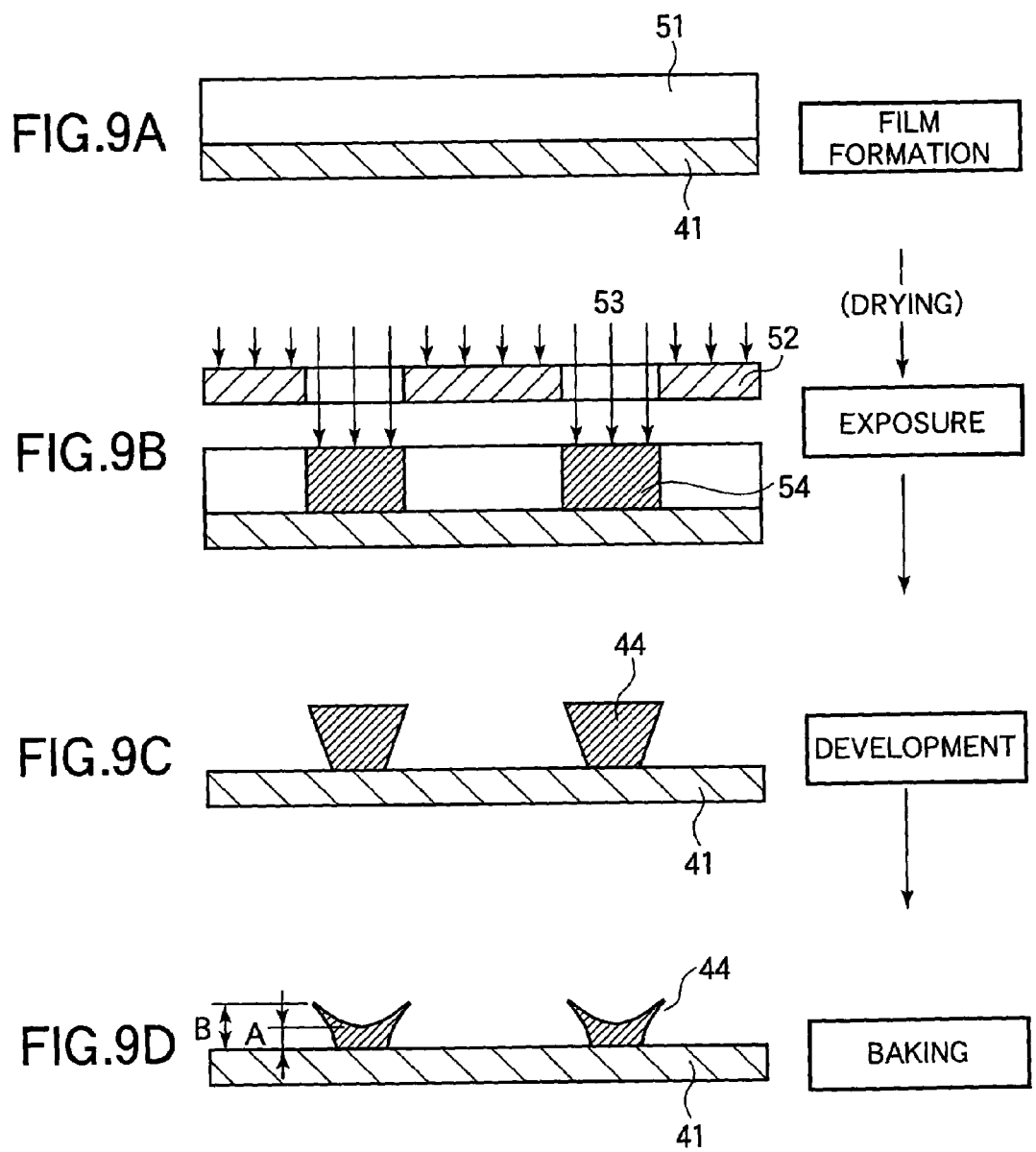

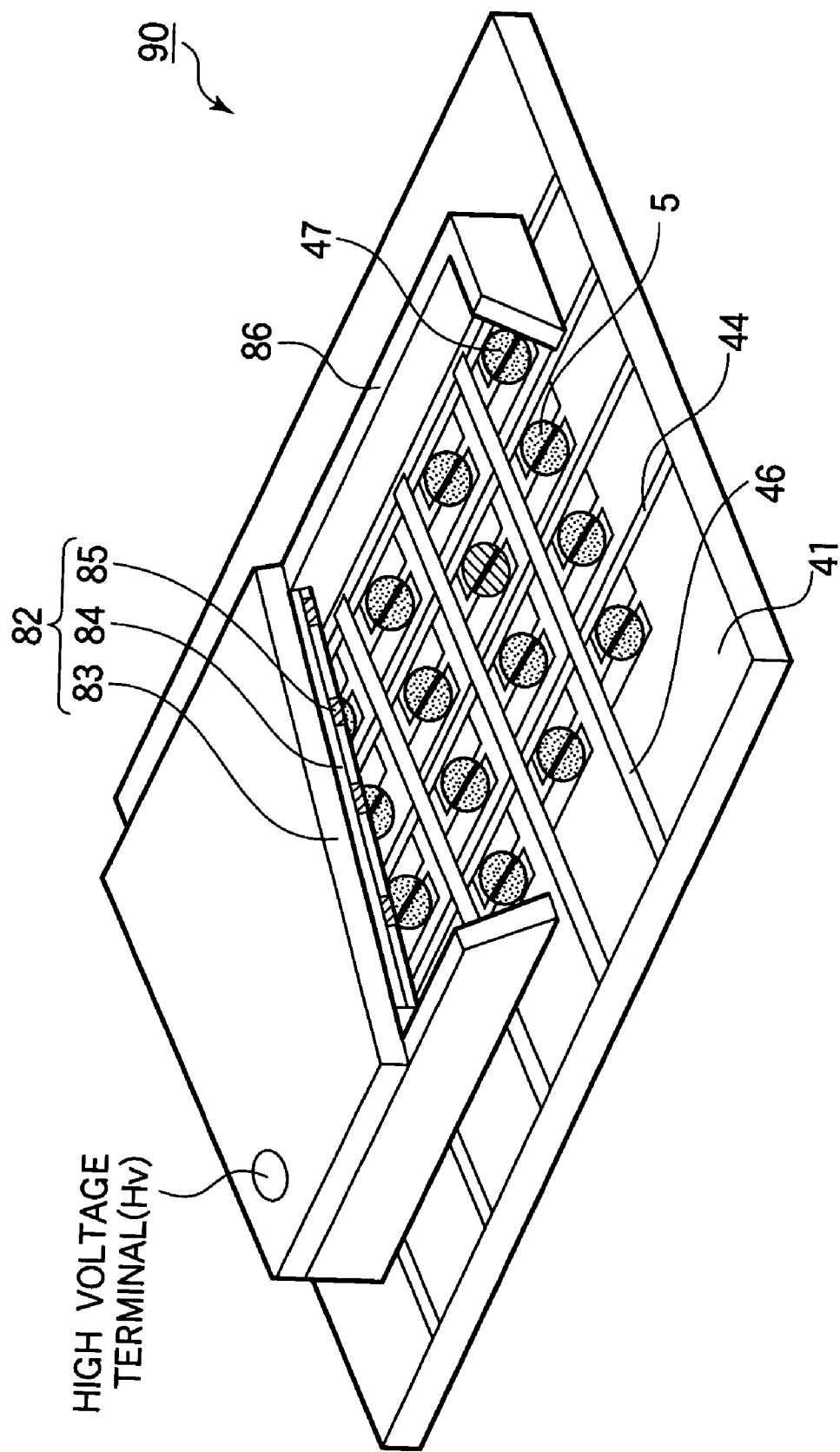

METHOD OF MANUFACTURING MEMBER PATTERN, METHOD OF MANUFACTURING WIRING STRUCTURE, METHOD OF MANUFACTURING ELECTRON SOURCE, AND METHOD OF MANUFACTURING IMAGE DISPLAY DEVICE

BACKGROUND OF THE INVENTION

1. Field of the Invention

The present invention relates to a method of manufacturing a member pattern such as a wiring structure, a method of manufacturing an electron source using the method of manufacturing a member pattern and a method of manufacturing an image display device using the method of manufacturing a member pattern.

2. Related Background Art

A method of manufacturing a member pattern in which an insulating film or conductive film is formed in a desired pattern on a substrate is used in a method of manufacturing a wiring structure. The wiring structure, in turn, is applied to an imaging device and an image display device, such as a plasma display panel (PDP), a liquid crystal display element (LCD), an electroluminescence display element (ELD) and an electron-emitting display element. In the following description, an electron-emitting display element will be taken as an example.

Electron-emitting elements have been disclosed in Japanese Patent Application Laid-Open No. 8-321254 and the like. FIG. 3A is a schematic plan view of a surface-conductive electron-emitting element, and FIG. 3B is a schematic cross-sectional view of the element. In FIG. 3, reference numeral 31 denotes a substrate, reference numerals 32 and 33 each denote an electrode, reference numeral 34 denotes a conductive thin film and reference numeral 35 denotes an electron emitting section.

The inventors have studied increasing of the area of an image forming device having a large number of such surface-conductive electron-emitting elements disposed on a substrate. There are many possible methods of fabricating an electron source substrate (wiring device) in which an electron-emitting element and a wiring are formed on a substrate. For example, a printing technique, such as screen printing or offset printing, may be diverted to the fabrication of the surface-conductive electron-emitting element and the electron source substrate including the same. Printing techniques are suited to fabricate a large-area pattern, and forming an electrode of the surface-conductive electron-emitting element by a printing technique allows a large number of surface-conductive electron-emitting elements to be easily fabricated.

In Japanese Patent Application Laid-Open No. 8-34110, there is disclosed a method of using screen printing to form an x-directional wiring extending in the x direction, a y-directional wiring extending in the y direction, and an insulating layer for insulating the x-directional wiring and the y-directional wiring from each other, the wirings being intended for driving each electron-emitting element on a rear plate (substrate). With reference to FIGS. 4 to 8, the method of manufacturing an electron source disclosed in this Japanese Patent Application Laid-Open No. 8-34110 will be now described.

First, plural pairs of electrodes 42, 43 are arranged on a substrate 41 (FIG. 4).

Then, a conductive paste is applied to the substrate by screen printing and baked, thereby forming a wiring (y-directional wiring) 44 that interconnects the electrodes 43 (FIG. 5).

Then, an insulating paste is applied to the substrate by screen printing and baked, thereby forming an insulating layer 45 that insulates a wiring (x-directional wiring) 46 described later and the wiring 44 from each other (FIG. 6).

Then, a conductive paste is applied to the substrate by screen printing and baked, thereby forming the wiring (x-directional wiring) 46 that interconnects the electrodes 42 (FIG. 7).

Finally, a conductive film 47 that interconnects the electrodes 42 and 43 of each pair is formed (FIG. 8).

According to this method, a thick-film wiring having a low resistance can be readily manufactured with a reduced process time per substrate and at a reduced cost.

Furthermore, in recent PDPs with a large screen and a high definition and displays using electron-emitting elements, printability of finer lines and spaces is required, and therefore, element electrodes, wirings and the like may be totally formed by photolithography.

In forming a large number of electron-emitting elements for display using the photolithography, the conventional NTSC requires hundreds of thousands of electron-emitting elements to be precisely integrated, and the HDTV requires millions of electron-emitting elements to be precisely integrated. In such a case, the wirings 44 and 46 and the interlayer insulating layers 45 are required to be formed with higher reliability.

The interlayer insulating layer is desirably formed thick so that the dielectric constant is not higher than a certain value to keep power consumption and heat generation during driving at a low level. In addition, any pin hole or the like has to be prevented from occurring. Thus, interlayer insulating layers stacked only in a single layer are not enough in many cases. Thus, in order to eliminate defects including pin hole short-circuit at a wiring intersection in a matrix structure having millions of wiring intersections, interlayer insulating layers may be stacked in two or more layers. However, even in such a structure having the insulating layers stacked in multiple layers, short-circuit sometimes occurs at an intersection between an x-directional wiring and a y-directional wiring.

SUMMARY OF THE INVENTION

An object of the invention is to provide a method of manufacturing a highly reliable member pattern having an insulation performance or conductivity.

Another object of the invention is to provide a method of manufacturing a member pattern in which occurrence of a pin hole can be suppressed.

A further object of the invention is to provide a method of manufacturing a member pattern capable of providing good contact between paired conductive members.

Still another object of the invention is to provide a method of fabricating a highly reliable wiring structure in which occurrence of a pin hole in an interlayer insulating layer is suppressed and short circuit between upper and lower wirings is few in number, a method of fabricating an electron source using the same, and a method of manufacturing an image display device using the same.

According to one aspect of the present invention, there is provided a method of manufacturing a member pattern having a patterned member on a substrate, comprising: a first exposure step of exposing a desired region of a negative type photosensitive material applied to the substrate to light from a first direction; a second exposure step of exposing the desired region of the negative type photosensitive material to light from a second direction opposite to said first direction; a development step of performing development after said exposure steps to form a precursor pattern of said member; and a step of baking said precursor pattern.

According to another aspect of the present invention, there is provided a method of manufacturing a member pattern having a patterned member on a substrate, comprising: a first exposure step of exposing a desired region of a negative type photosensitive material applied to the substrate to light from a first direction; a development step of performing development after said first exposure step to form a precursor pattern of said member; a second exposure step of exposing the precursor pattern of said member to light from a second direction opposite to said first direction; and a step of baking said precursor pattern after said second exposure step.

According to a further aspect of the present invention, there is provided a method of manufacturing a wiring structure having, on a substrate, a first wiring and a second wiring intersecting said first wiring and disposed over the first wiring through an insulator, wherein a process of forming said insulator comprises: a first exposure step of exposing a desired region of a negative type photosensitive insulating material to light from a first direction, the negative type photosensitive insulating material being applied to extend over said substrate and the first wiring disposed on the substrate; a second exposure step of exposing the desired region of the negative type photosensitive insulating material to light from a second direction opposite to said first direction; a step of performing development after said exposure steps to form a precursor pattern of said insulator; and a step of baking the precursor pattern of said insulator.

According to still another aspect of the present invention, there is provided a method of manufacturing a wiring structure having, on a substrate, a first wiring and a second wiring intersecting said first wiring and disposed over the first wiring through an insulator, wherein a process of forming said insulator comprises: a first exposure step of exposing a desired region of a negative type photosensitive insulating material to light from a first direction, the negative type photosensitive insulating material being applied to extend over said substrate and the first wiring disposed on the substrate; a step of performing development after said first exposure step to form a precursor pattern of said insulator; a second exposure step of exposing the precursor pattern of said insulator to light from a second direction opposite to said first direction; and a step of baking the precursor pattern after said second exposure step.

According to a further aspect of the present invention, there is provided a method of manufacturing an electron source having a wiring structure and an electron emitting element connected to said wiring structure, the wiring structure having, on a substrate, a first wiring and a second wiring intersecting said first wiring and disposed over the first wiring through an insulator, wherein said wiring structure is manufactured in the method described above.

According to still another aspect of the present invention, there is provided a method of manufacturing an image display device having a wiring structure, an electron emitting element connected to said wiring structure and an image display member for displaying an image by irradiation with electrons from said electron emitting element, the wiring structure having, on a substrate, a first wiring and a second wiring intersecting said first wiring and disposed over the first wiring through an insulator, wherein said wiring structure is manufactured in the method described above.

BRIEF DESCRIPTION OF THE DRAWINGS

FIG. 2 illustrates a method of forming an interlayer insulating layer according to the present invention;

FIGS. 9A, 9B, 9C and 9D are diagrams for illustrating a process of manufacturing an electron source substrate;

FIG. 13 is a schematic perspective view of an exemplary configuration of an image display device according to the present invention.

DETAILED DESCRIPTION OF THE PREFERRED EMBODIMENTS

Figure 1A:
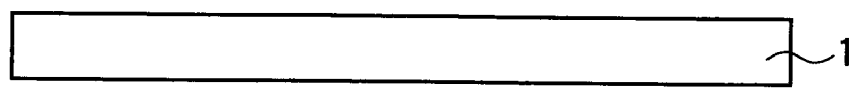
FIGS. 1A, 1B, 1C and 1D illustrate a method of forming an insulating film according to the present invention.

The present invention provides a method of manufacturing a member pattern having a patterned member on a substrate, comprising: a first exposure step of exposing a desired region of a negative type photosensitive material applied to the substrate to light from a first direction; a second exposure step of exposing the desired region of the negative type photosensitive material to light from a second direction opposite to said first direction; a development step of performing development after said exposure steps to form a precursor pattern of said member; and a step of baking said precursor pattern.

In addition, the present invention provides a method of manufacturing a member pattern having a patterned member on a substrate, comprising: a first exposure step of exposing a desired region of a negative type photosensitive material applied to the substrate to light from a first direction; a development step of performing development after said first exposure step to form a precursor pattern of said member; a second exposure step of exposing the precursor pattern of said member to light from a second direction opposite to said first direction; and a step of baking said precursor pattern after said second exposure step.

The method of manufacturing a member pattern according to the present invention is more preferably applied to a case where said negative type photosensitive material is applied to extent over a member previously disposed on said substrate and said substrate.

The method of manufacturing a member pattern according to the present invention is more preferably applied to a case where the member previously disposed on said substrate has a higher optical reflectance than said substrate.

The method of manufacturing a member pattern according to the present invention is more preferably applied to a case where the member previously disposed on said substrate is a member that is formed in a process involving exposure, development and baking of a photosensitive material.

The method of manufacturing a member pattern according to the present invention is more preferably applied to a case where the member previously disposed on said substrate has an overhanging part in the cross section thereof.

The method of manufacturing a member pattern according to the present invention is more preferably applied to a case where said patterned member is an insulating member, and said insulating member has a contact hole for electrically interconnecting paired conductive members stacked on said substrate with the insulating member interposed therebetween.

In the method of manufacturing a member pattern according to the present invention described above, the member pattern is an insulating member pattern or conductive member pattern. Since the method includes the first exposure step of performing exposure from the first direction and the second exposure step of performing exposure from the second direction opposite to the first direction, the amount of the unreacted monomer remaining in the photosensitive material after exposure can be reduced. Therefore, occurrence of pin holes after the baking step can be reduced to the minimum. In addition, since occurrence of pin holes can be reduced, the resulting member pattern is highly continuous (has a high density). Thus, in the case of an insulating member, a member pattern having a high insulation performance can be manufactured, and in the case of a conductive member, a member pattern having a high conductivity can be manufactured.

Furthermore, if in the method of manufacturing a member pattern according to the invention described above, the development step of performing development to form the precursor pattern of said member is conducted following said first exposure step, and then, the second exposure step of exposing the precursor pattern of said member to light from a second direction opposite to said first direction is conducted, there is an advantage that the second exposure step can be conducted without any exposure mask.

Furthermore, the method of manufacturing a member pattern according to the invention described above is more preferably applied to a case where said negative type photosensitive material is applied to extend over a member previously disposed on said substrate and said substrate. This is because, although the area of the substrate on which the member is previously disposed and the area thereof on which the member is not disposed are different in optical reflectance during exposure, the problem of occurrence of pin holes caused by insufficient exposure of the area having a lower reflectance can be eliminated. In addition, the method can be more effectively applied to a case where the member previously disposed on the substrate has a higher optical reflectance than the substrate.

Furthermore, the method of manufacturing a member pattern according to the invention described above is more preferably applied to a case where the member previously disposed on said substrate has an overhanging part in the cross section thereof. This is because there is eliminated the problem of occurrence of pin holes caused by insufficient exposure of the area which is shadowed by the overhanging part when being exposed to light from above. Furthermore, such an overhanging cross-sectional profile often appears in members formed in a process involving exposure, development and baking of a photosensitive material, and therefore, the invention is more preferably applied to a case where the member previously disposed on said substrate is a member that is formed in a process involving exposure, development and baking of a photosensitive material.

Furthermore, if said patterned member is an insulating member, and said insulating member has a contact hole for electrically interconnecting paired conductive members stacked on said substrate with the insulating member interposed therebetween, excessive exposure of the area of the contact hole can be prevented so that the resulting contact hole can have an adequate size. Therefore, the method of manufacturing a member pattern according to the invention described above can provide good contact between the paired conductive members.

The method of manufacturing a member pattern described above is preferably applied to a method of manufacturing a wiring structure for various electronic devices.

The present invention provides a method of manufacturing a wiring structure having, on a substrate, a first wiring and a second wiring intersecting said first wiring and disposed over the first wiring through an insulator, wherein a process of forming said insulator comprises: a first exposure step of exposing a desired region of a negative type photosensitive insulating material to light from a first direction, the negative type photosensitive insulating material being applied to extend over said substrate and the first wiring disposed on the substrate; a second exposure step of exposing the desired region of the negative type photosensitive insulating material to light from a second direction opposite to said first direction; a step of performing development after said exposure steps to form a precursor pattern of said insulator; and a step of baking the precursor pattern of said insulator.

Furthermore, the invention provides a method of manufacturing a wiring structure having, on a substrate, a first wiring and a second wiring intersecting said first wiring and disposed over the first wiring through an insulator, wherein a process of forming said insulator comprises: a first exposure step of exposing a desired region of a negative type photosensitive insulating material to light from a first direction, the negative type photosensitive insulating material being applied to extend over said substrate and the first wiring disposed on the substrate; a step of performing development after said first exposure step to form a precursor pattern of said insulator; a second exposure step of exposing the precursor pattern of said insulator to light from a second direction opposite to said first direction; and a step of baking the precursor pattern after said second exposure step.

Furthermore, the method of manufacturing a wiring structure is more preferably applied to a case where said first wiring has a higher optical reflectance than said substrate.

Furthermore, the method of manufacturing a wiring structure is more preferably applied to a case where said first wiring is a member that is formed in a process involving exposure, development and baking of a photosensitive material.

Furthermore, the method of manufacturing a wiring structure is more preferably applied to a case where said first wiring has an overhanging part in the cross section thereof.

Furthermore, the method of manufacturing a wiring structure is more preferably applied to a case where said insulator has a contact hole for electrically interconnecting paired conductive members stacked on said substrate with the insulator interposed therebetween.

Furthermore, the method of manufacturing a wiring structure is more preferably applied to a wiring structure which has, on a substrate, a plurality of first wirings and a plurality of second wirings intersecting said first wirings and disposed over the first wirings through insulators.

The method of manufacturing a wiring structure described above has the same advantages for the same reason as the method of manufacturing a member pattern described earlier. Therefore, the method of manufacturing a wiring structure can suppress occurrence of pin holes in the insulator and provides a reduced number of short circuits between the upper and lower wirings, and thus is highly reliable.

Furthermore, the method of manufacturing a wiring structure is preferably applied to a method of manufacturing an electron source and a method of manufacturing an image display device.

The present invention provides a method of manufacturing an electron source having a wiring structure and an electron emitting element connected to said wiring structure, the wiring structure having, on a substrate, a first wiring and a second wiring intersecting said first wiring and disposed over the first wiring through an insulator, wherein said wiring structure is manufactured in any of the methods described above.

Furthermore, the present invention provides a method of manufacturing an image display device having a wiring structure, an electron emitting element connected to said wiring structure and an image display member for displaying an image by irradiation with electrons from said electron emitting element, the wiring structure having, on a substrate, a first wiring and a second wiring intersecting said first wiring and disposed over the first wiring through an insulator, wherein said wiring structure is manufactured in any of the methods described above.

Furthermore, the method of manufacturing an electron source and the method of manufacturing an image display device are more preferably applied to an electron source which comprises a wiring structure and a plurality of electron emitting elements matrix-connected to the wiring structure, the wiring structure having, on a substrate, a plurality of first wirings and a plurality of second wirings intersecting said first wirings and disposed over the first wirings through insulators.

The method of manufacturing an electron source and the method of manufacturing an image display device described above have the same advantages for the same reason as the method of manufacturing a member pattern described earlier. Therefore, the method of manufacturing an electron source and the method of manufacturing an image display device can suppress occurrence of pin holes in the insulator and provide a reduced number of short circuits between the upper and lower wirings, and thus are highly reliable.

For better understanding of the invention, first, how the invention has been devised will be described in short.

Figure 8:
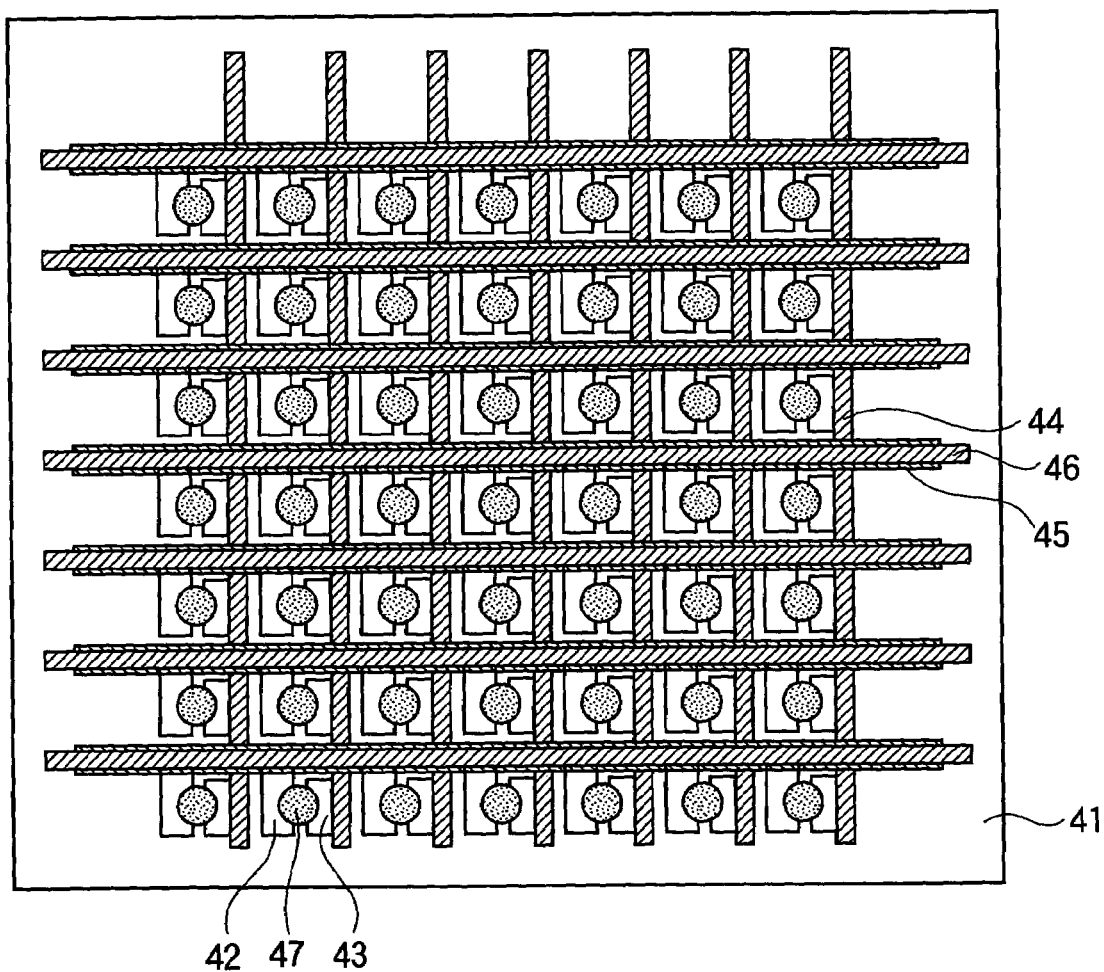
FIG. 8 is a diagram for illustrating the process of manufacturing an electron source substrate.

As a result of earnest investigation and observation concerning inter-wiring short circuit in an XY matrix wiring substrate as shown in FIG. 8, the inventors found that inter-wiring short circuit often occurs at an intersection between an x-directional wiring 46 and a y-directional wiring 44 where the lower one of the intersecting wirings has an inverted-trapezoidal cross section, that is, an edge-curling cross section, and thus is in overhanging state with respect to the substrate. Based on this finding, the inventors have devised the invention.

In the inventor's view, such an overhanging state results in insufficient exposure at an area shaded by the overhang during exposure of the interlayer insulating layer using a mask, whereby an unreacted monomer remains in the photosensitive insulating material in a large amount, which abnormally causes a gas during baking after development to cause a pin hole.

This is an inevitable problem with negative-type photosensitive materials which contain a monomer which reacts when being irradiated with light to form a bridge structure, which remains after development. Monomers having a multiple bond, such as acrylic monomer, which are often used for a photosensitive insulating layer are baked at a higher baking temperature than partially polymerized polymers. It is considered that if glass frit in the interlayer insulating material begins to be molten when the monomer is burned, a pin hole occurs at a place where degassing occurs.

Furthermore, generally, photosensitive wiring materials tend to have an inverted trapezoidal cross section after development because of their exposure depth or the like. Furthermore, if baking is conducted with the photosensitive wiring material having such a cross section, edge curling occurs in which an edge of the pattern is bent upward. Material manufactures are now trying to solve this problem of wiring materials. However, in fact, there is no photosensitive wiring material commercially available.

In the case of a wiring having no edge curl, in the vicinity of the wiring pattern or base layer, the photosensitive insulating material can be adequately cured because the exposure light from above is reflected therefrom. However, at an area where no wiring pattern or base layer exists, the photosensitive insulating material is exposed insufficiently because of lack of reflection of the exposure light and thus tends to be insufficiently cured partially, and gas tends to be generated at such an insufficiently cured part to form a pin hole.

Thus, according to an embodiment of the invention, in patterning a photosensitive insulating material, if the exposure light from above is insufficient for reaction of the photosensitive insulating material, light is applied to the material from the back side of the substrate to advance the reaction, for example. Thus, the unreacted photosensitive monomer is eliminated, and a pin hole can be prevented from being caused by generation of an air bubble during a process step of baking the insulating layer.

According to the embodiment of the invention, a second exposure step may be conducted immediately after a first exposure step. However, if the second exposure step is conducted after the latent image formed by the first exposure is developed, the second exposure step can be conducted without any exposure mask.

Here, in this specification, "edge curl" refers to a height of a bent edge of a patterned wiring or insulating material with respect to the center of the pattern, and "overhang" refers to a state in which an edge of the wiring rises from the substrate surface because of edge curling to form a clearance.

According to the embodiment of the invention, a first wiring can have any cross section, such as one having an edge curl or overhang, or rectangular, trapezoidal, triangular or semi-circular one. However, the embodiment of the invention is significantly effective in a case where a side face of the first wiring forms with the substrate surface an acute angle (in the case of overhang) or an obtuse angle (in the case of printing).

The substrate used in the embodiment of the invention may be a translucent substrate such as of soda glass, silicate glass or quartz glass, a semiconductor substrate such as of silicon, or a metal substrate. However, a translucent substrate which can transmit exposure light is preferably used.

The first wiring used in the embodiment of the invention may be a conductor deposited by applying, sputtering, vacuum evaporation, CVD or plating and patterned by photolithography, or conductor patterned by printing and may be a thin film or thick film composed of a sintered body. The conductor may be a metal such as Au, Ag, Cu, Al, Cr, Mo, W, Ni, Co, Pt, Ta or Ti, an alloy of two or more of these metals, or an alloy of any of these metals and Si, Nd or the like. In addition, the first wiring may be composed of a single layer or a stack of multiple layers of different materials. Furthermore, while the thickness of the first wiring is not limited particularly, it is preferably selected from a range of 4 μm to 20 μm.

Furthermore, a second wiring used in the embodiment of the invention may be the same as the first wiring as described above in structure and material.

It is essential only that the photosensitive used in the embodiment of the invention has a required insulating property when it is patterned in the exposure and development steps to form an insulating film, and it may be one whose photosensitivity is completely eliminated after patterned. In particular, a negative type photosensitive insulating paste is preferably used, which contains, for example, 40 to 60 percents by volume of insulating material, such as glass, the rest being a well-known material composed of a photosensitive resin, a solvent and the like. While the thickness of the photosensitive insulating material is not particularly limited, it has a thickness of about 10 μm to 40 μm after dried.

In the following, exemplary preferred embodiments of the invention will be described in detail with reference to the drawings. However, unless otherwise described, the scope of the invention is not limited to the dimensions, materials, shapes, relative positions and the like of components described in the embodiments.

(Embodiment 1)

One exemplary embodiment of a method of forming an insulating film according to the invention will be described with reference to FIGS. 1A to 1D.

First, a translucent substrate 1 made of glass or the like, which can transmit exposure light, is provided (FIG. 1A).

Figure 1B:
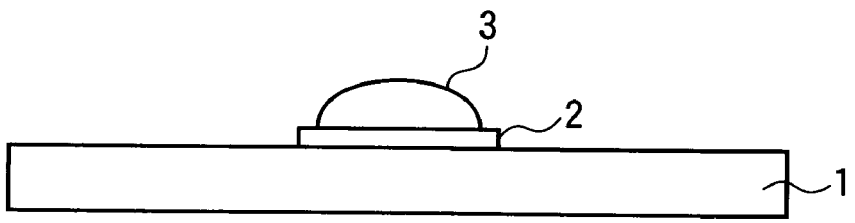

Then, as required, a base layer 2 made of a conductor such as platinum is formed, and then, a conductive paste is applied by printing or the like and fired. In this way, a wiring pattern 3 having a thickness of about 5 μm to 20 μm, for example, is formed (FIG. 1B). In this example, the side face of the wiring pattern 3 forms an obtuse angle with the surface of the substrate 1.

Figure 1C:
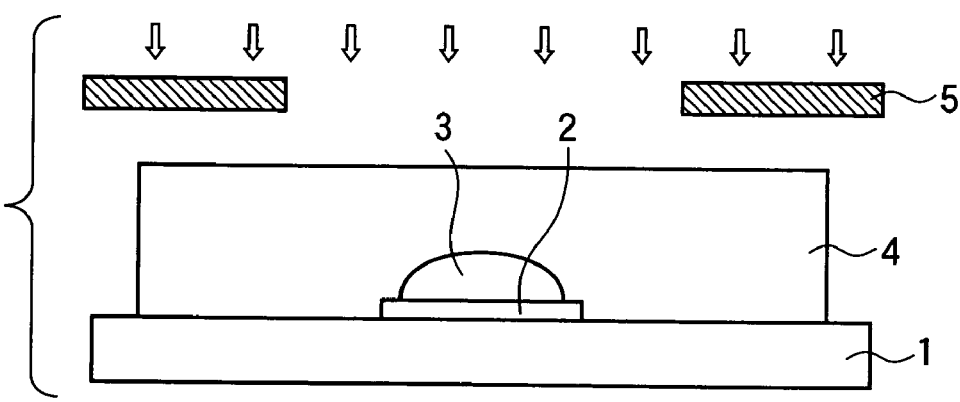

Then, a negative type photosensitive insulating paste 4 is applied to the substrate by printing and dried (FIG. 1C). The film of the paste has a thickness of about 10 μm to 40 μm after dried, for example. The photosensitive insulating paste may be one containing 40 to 60 percents by volume of glass, the rest being a photosensitive resin, a solvent and the like, for example.

Then, exposure is conducted by applying light to the substrate from above through an optical mask 5 for forming an insulating layer pattern (FIG. 1C). The exposure light may be one having a well-known wavelength, such as g-ray, h-ray or i-ray, and the quantity of light is about 60 mJ/cm² to 200 mJ/cm², for example.

Figure 1D:
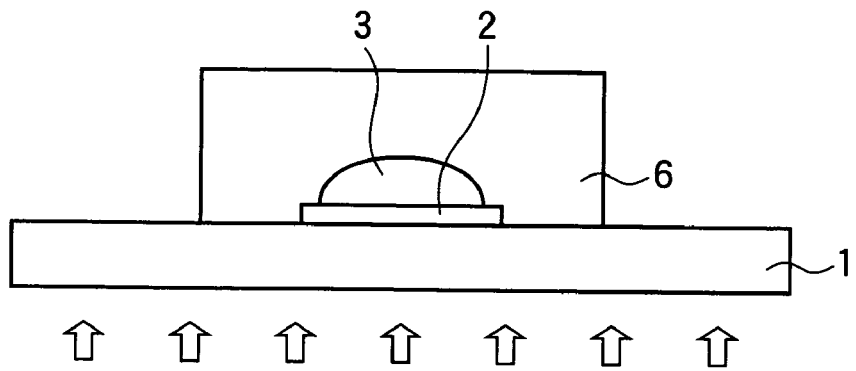

Then, after development is conducted to provide the pattern, exposure is conducted again from the back surface of the substrate. The exposure can be determined in consideration of the thickness, transmittance or the like of the substrate. Then, the substrate is baked at a temperature of 300° C. to 800° C., for example, to form an insulating layer pattern 6 (FIG. 1D). The thickness of the insulating pattern 6 after baked is about 40 to 55% of that before baked, and is about 4 μm to 22 μm, for example.

According to the method of forming an insulating film according to the preferred embodiment of the invention described above, the photosensitive insulating paste is exposed to light again from the back surface of the substrate once it is exposed and developed. Therefore, the photosensitive insulating paste in the vicinity of the substrate surface can be adequately exposed to light and cured, and thus, no gas is generated from the insulating layer pattern and a pin hole can be prevented from occurring.

Furthermore, in the case where an insulating film is used as an interlayer insulating layer, an opening for a contact hole is sometimes patterned simultaneously with patterning of the insulating film. In such a case, if light is applied to the substrate only from above with an increased quantity of light, the area corresponding to the contact hole may be exposed to excessive light to provide a contact hole with a varied size. However, according to the method of forming an insulating film of the invention, since patterning can be attained without the need to increase the quantity of exposure light applied to the substrate from above, a contact hole having a desired size can be formed.

(Embodiment 2)

Now, an application of the method of forming an insulating film, which is a preferred embodiment of the invention, will be described, primarily focusing on an electron source substrate having a structure in which electron emitting elements are disposed near intersections of XY matrix wirings as shown in FIG. 8.

Figure 3A:
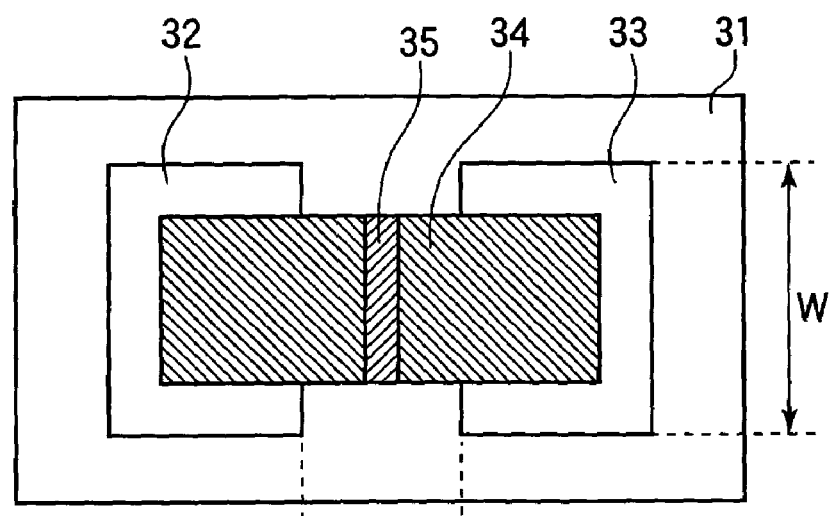
FIGS. 3A and 3B schematically show an example of an electron-emitting element formed on an electron source substrate according to the present invention.
Figure 3B:
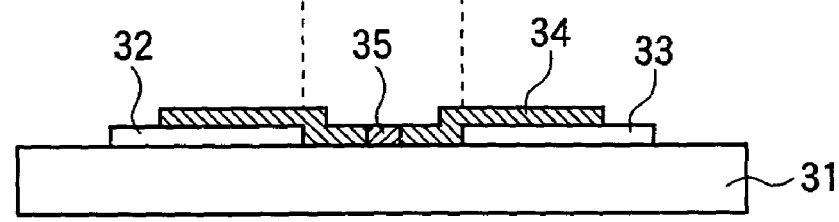

Preferably, the electron emitting element provided on the electron source substrate according to this embodiment is a two-terminal cold cathode capable of being matrix-driven. For example, a surface-conductive electron emitting element shown in FIGS. 3A and 3B or a transverse field emission (FE) electron emitting element can be preferably used. In this example, the surface-conductive electron emitting element shown in FIGS. 3A and 3B are formed.

(Formation of Element Electrode)

Figure 4:
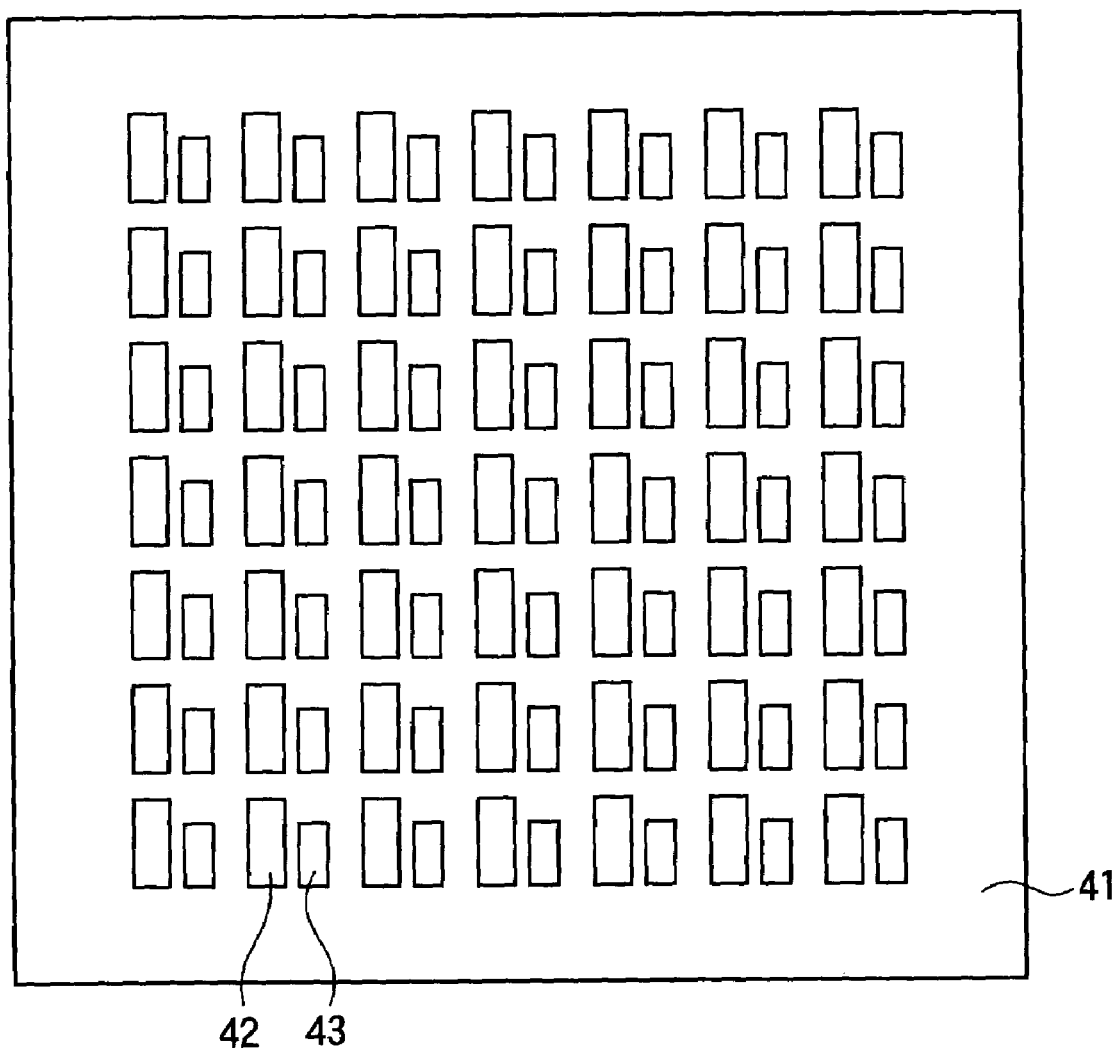
FIG. 4 is a diagram for illustrating a process of manufacturing an electron source substrate.

First, a large number of arranged electrodes 42, 43 are formed on a well-cleaned substrate 41 by photolithography or the like (FIG. 4).

The substrate 41 is made of glass or the like and has an area and a thickness appropriately determined depending on the number of electron emitting elements disposed thereon and the design shape of each element, and if the electron source constitutes a part of a container during use, depending on a mechanical condition or the like such as atmospheric pressure proof structure for maintain the container under vacuum.

Generally, the glass is soda glass, which is inexpensive. However, it is required that the substrate has a silicon oxide film having a thickness of about 0.5 μm, which serves as a sodium blocking layer, is formed by sputtering thereon. Besides, the substrate may be a glass substrate containing less sodium or a quartz substrate.

To form the element electrodes 42, 43, a selection can be made from a method of depositing a metal thin film by a vacuum deposition process such as vacuum evaporation, sputtering or plasma CVD and patterning the metal thin film by photolithography or the like, a method of applying an MO paste containing an organometallic compound by offset printing and baking the applied paste, and the like.

The element electrodes 42, 43 are located at intervals of several to several tens μm and have a thickness of several tens nm. They can be made of any conductive material. For example, they may be made of a metal such as Pt, Ti, Al or Cu, an alloy thereof, a metal such as $RuO_2$ or Pd—Ag, a printed conductor composed of an oxide thereof and glass or the like, a semiconductor material such as polysilicon, or a translucent conductor such as $In_2O_3$—$SnO_2$.

(Formation of y-directional Wiring)

Figure 5:
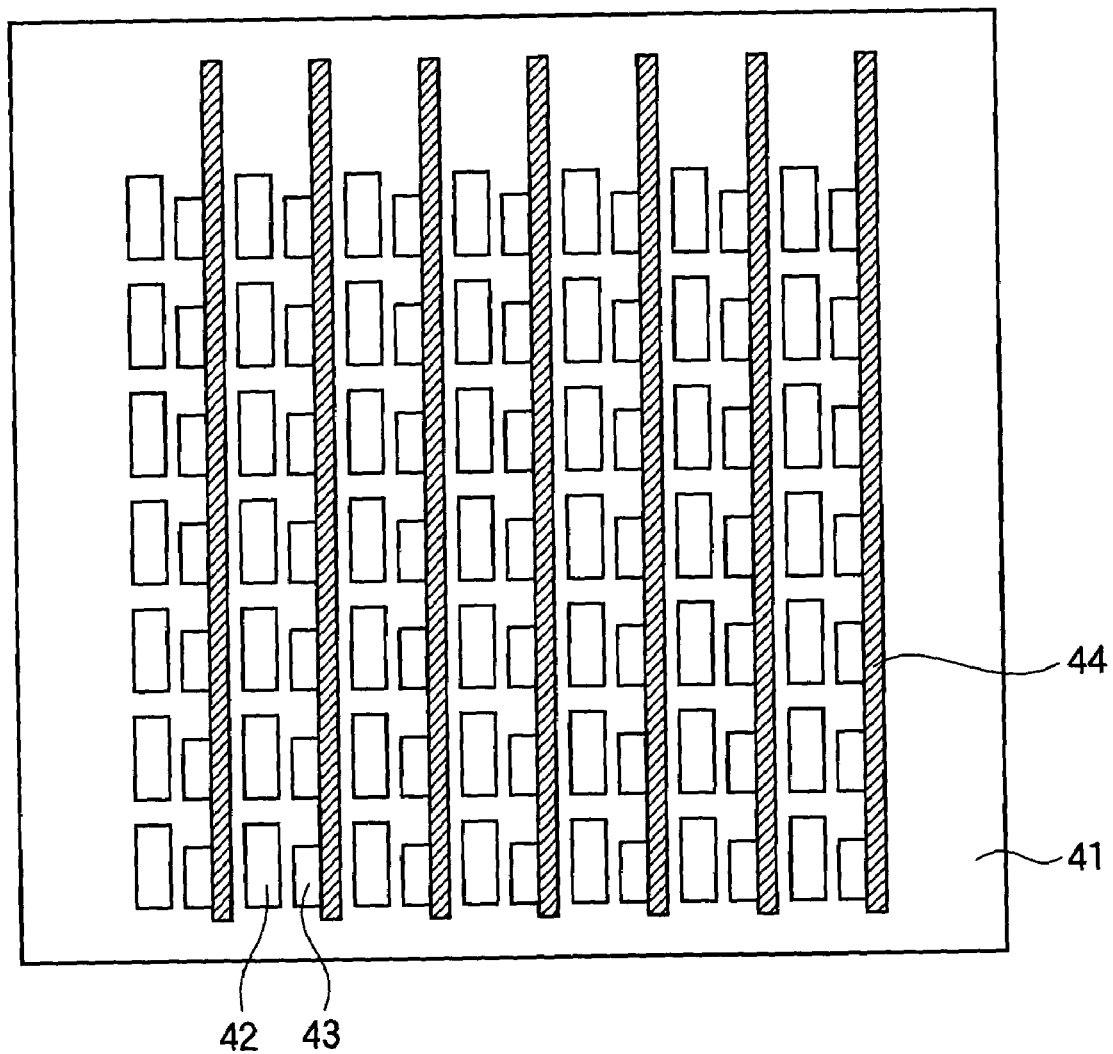
FIG. 5 is a diagram for illustrating the process of manufacturing an electron source substrate.

Then, a y-directional wiring 44 that interconnects the electrodes 43 is formed using a photosensitive conductive paste (FIG. 5). A process of forming the y-directional wiring 44 will be described in detail with reference to FIGS. 9A to 9D.

First, in a deposition step shown in FIG. 9A, a layer 51 is formed by, for example, screen-printing the photosensitive conductive paste onto the substrate 41. Then, the photosensitive conductive paste layer is dried at a temperature of about 80 to 150° C.

Then, in an exposure step shown in FIG. 9B, a mask 52 having an opening corresponding to a desired wiring pattern is disposed on the substrate, and the layer 51 of the dried photosensitive conductive paste is exposed to light.

In a development step, which depends on the photosensitive paste used, development is conducted using an alkalescent solution and stopped by rinsing the substrate with pure water, and then the substrate is dried by blowing to provide the y-directional wiring 44 having an inverted-trapezoidal cross section as shown in FIG. 9C.

Furthermore, a baking step shown in FIG. 9D is performed. This step provides the formed y-directional wiring 44 with an overhang.

(Formation of Interlayer Insulating Layer)

Figure 6:
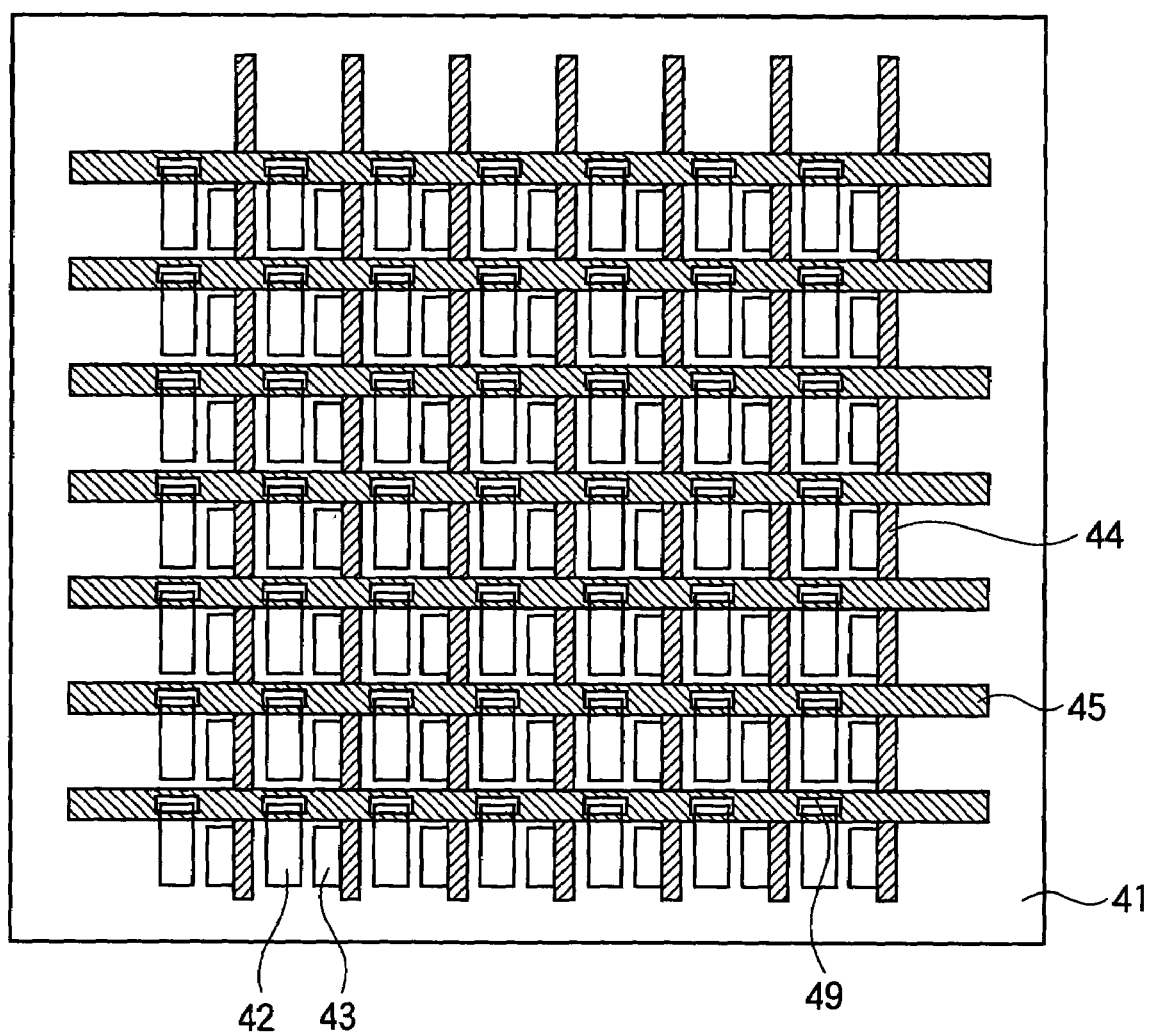
FIG. 6 is a diagram for illustrating the process of manufacturing an electron source substrate.

Then, an interlayer insulating layer 45 is formed using an insulating paste (FIG. 6). The process of forming the interlayer insulating layer will be described with reference to FIG. 2.

First, a film of a photosensitive insulating paste is deposited on the substrate 41 by screen printing as in the formation of the y-directional wiring. Then, first exposure is conducted by applying light to the substrate 41 from above through a mask 11 having a desired insulating pattern. Here, reference numeral 12a denotes a region cured in the first exposure, and reference numeral 12b denotes a region not cured in the first exposure.

Then, a development step, which depends on the photosensitive paste used, is conducted. Development is conducted using an alkalescent solution and stopped by rinsing the substrate with pure water, and then the substrate is dried by blowing to provide the photosensitive insulating pattern in the desired pattern.

Furthermore, second exposure is performed on the whole surface of the substrate 41 by applying light from the back surface of the substrate without a mask. At this time, taking into account the absorption by the substrate, the quantity of light is set to be enough for the photosensitive insulating material to react. Reference numeral 12c denotes a region cured in the second exposure step.

In the first exposure from above the substrate, light reaches to an insufficient depth at a region of the overhang, and thus, the photosensitive resin is insufficiently cured. Thus, after development, by applying sufficient light to the substrate from the back side thereof in the second exposure, the resin beneath the overhang can be cured adequately.

Then, baking is conducted to provide the interlayer insulating layer 45 in the desired pattern (FIG. 6). Here, reference numeral 49 denotes a contact hole.

(Formation of x-directional Wiring)

Figure 7:
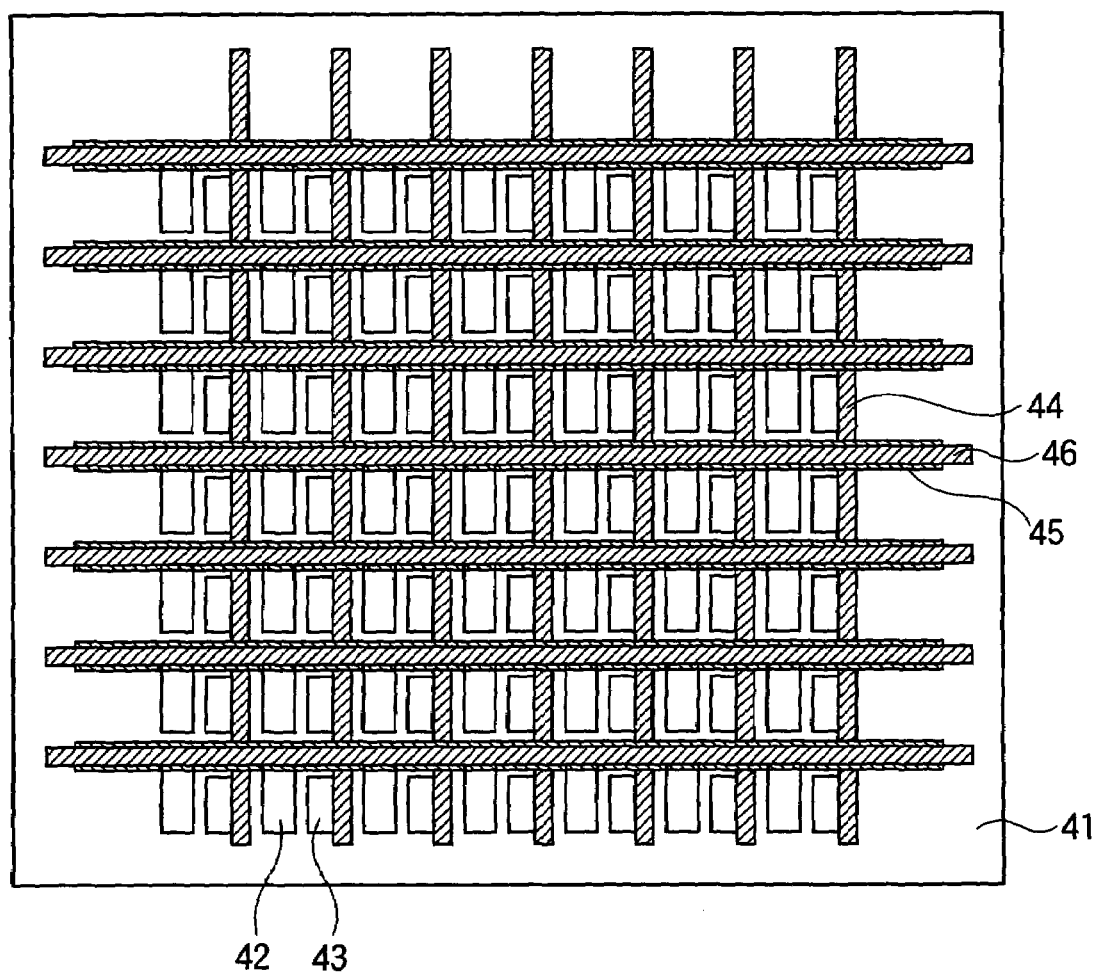
FIG. 7 is a diagram for illustrating the process of manufacturing an electron source substrate.

Then, an x-directional wiring 46 that interconnects the electrodes 42 is formed using a photosensitive conductive paste (FIG. 7). The x-directional wiring 46 can be formed with reduced dimensional precision compared to the y-directional wiring 44. Therefore, a typical conductive paste can be directly patterned by applying to the substrate by screen printing and then baked.

Thus, the substrate having the XY matrix wirings can be produced.

(Formation of Element Film)

An element film (conductive film) 47 is formed to lie across the element electrodes 42 and 42 (FIG. 8).

For a better electron emitting characteristic, as the element film 47, a particulate film is particularly preferable. The thickness of the film is appropriately determined in consideration of step coverage to the element electrodes 42, 43, the resistance value between the element electrodes, a forming processing condition described later and the like. However, the film preferably has a thickness of 1 to 50 nm. The sheet resistance thereof is preferably $10^3$ to $10^7$ Ω/□.

In general, the element film is suitably made of palladium, Pd. However, the invention is not limited thereto. Furthermore, as for the deposition process, sputtering, a process of performing baking after applying a solution or the like may be appropriately used.

(Energization Forming Step)

In this step referred to as an energization forming, the element film is energized to cause a crack therein, thereby forming an electron emitting section.

To be specific, a hood-shaped lid is placed over the whole substrate except for the leading electrodes at the periphery of the substrate, a vacuum is created therein, a voltage is applied across the x-directional wiring and y-directional wiring from an external power supply via the electrode terminals to flow a current between the element electrodes, thereby forming a clearance (crack) due to a structural change at the region of the element film 47. This clearance region constitutes the element emitting section. While electron emission occurs, under a predetermined voltage, in the vicinity of the clearance provided in this energization forming step, the electron emission efficiency is extremely low in this state.

Figure 11A:
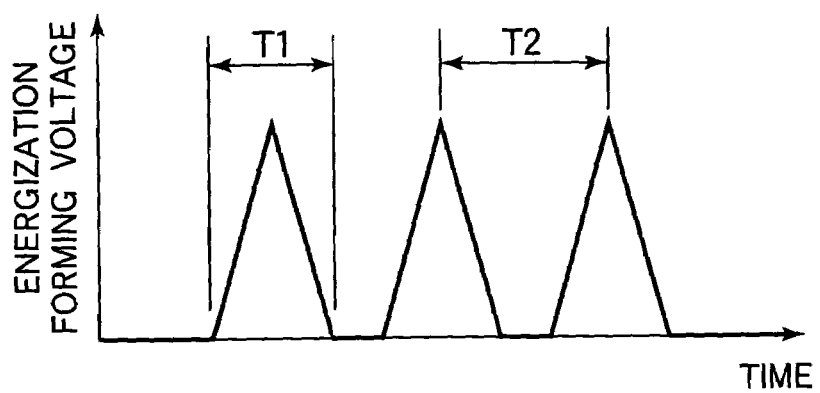
FIGS. 11A and 11B show examples of an energization forming voltage.
Figure 11B:
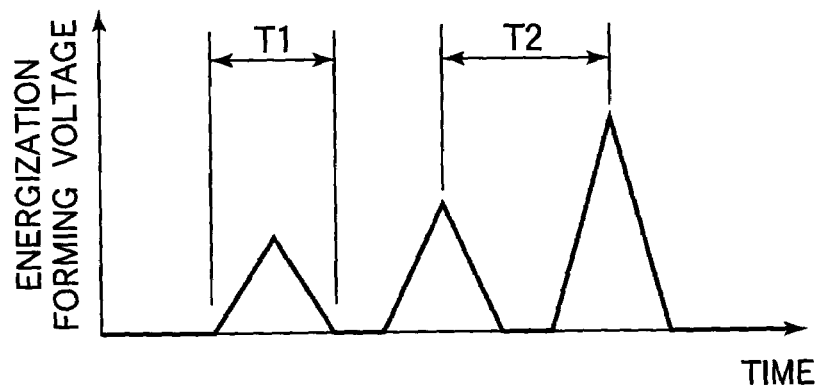

Examples of a voltage waveform for an energization forming are shown in FIGS. 11A and 11B particularly preferred voltage waveform is a pulse waveform. Pulses with a constant pulse peak value may be applied sequentially as shown in FIG. 11A, or pulses with increasing pulse peak values may be applied as shown in FIG. 11B.

First, the case where the pulse peak value is constant will be described with reference to FIG. 11A. In FIG. 11A, reference characters T1 and T2 denote a pulse width and a pulse interval of a voltage waveform, respectively. Typically, T1 is set within a range of 1 μs to 10 ms, and T2 is set within a range of 10 μs to 100 ms. The peak value of the triangular wave (peak voltage in an energization forming) is appropriately selected depending on the shape of the electron emitting element. Under these conditions, a voltage is applied for a time ranging from several seconds to several tens minutes, for example. The pulse waveform is not limited to the triangular one, and a desired waveform such as rectangular waveform may be used.

Then, the case where the pulse peak value is increased during application of the voltage pulse will be described with reference to FIG. 11B. In FIG. 11B, reference characters T1 and T2 denote the same as in FIG. 11A. The peak value of the triangular wave (peak voltage in an energization forming) can be increased in increments of 0.1 V, for example.

An energization forming can be finished when the resistance value determined from the measurement of the current flowing through the element during pulse voltage application becomes equal to or higher than 1 MΩ, for example.

As described above, the electron emission efficiency is extremely low in the state after this forming processing. Thus, to increase the electron emission efficiency, a processing referred to as activation is desirably performed on the element.

(Activation Step)

The activation can be attained by repeatedly applying a pulse voltage across the element electrodes 42 and 43 under an appropriate vacuum and in the presence of an organic compound. Then, a gas containing carbon atoms is introduced, and carbon or carbon compound derived therefrom is deposited as a carbon film in the vicinity of the clearance (crack).

An example of this step will be described. For example, tolunitrile is used as a carbon source and is introduced into the vacuum space through a slow leak valve, and the vacuum space is maintained at a pressure of about $1.3 \times 10^{-4}$ Pa. The pressure of tolunitrile introduced, which slightly depends on the shape of the vacuum device, components of the vacuum device or the like, is preferably within a range of $1 \times 10^{-5}$ Pa to $1 \times 10^{-2}$ Pa.

Figure 12A:
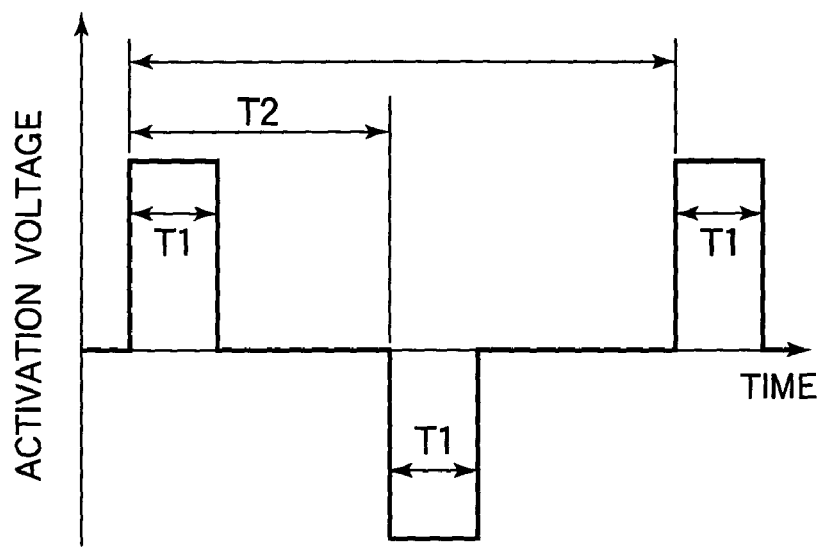
FIGS. 12A and 12B show examples of an activation voltage.
Figure 12B:
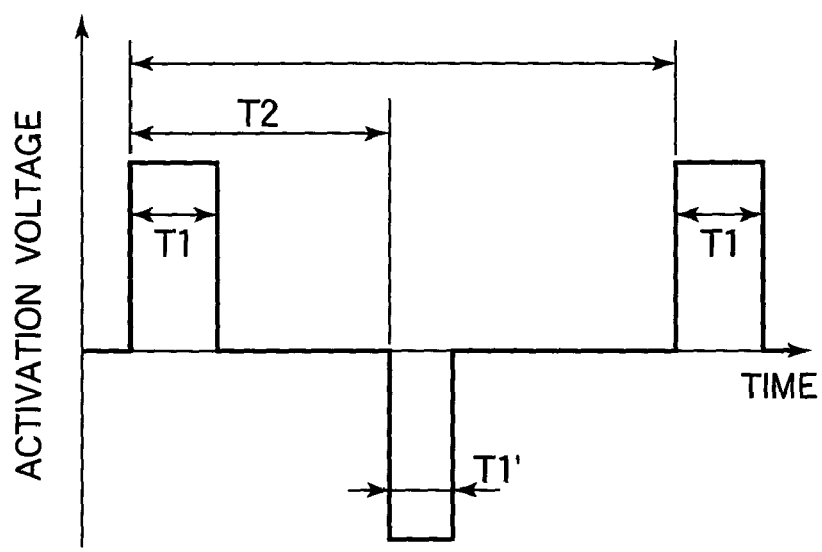

FIGS. 12A and 12B show preferred examples of voltage application in the activation step. The maximum value of the applied voltage is appropriately selected from a range of 10 V to 20 V.

In FIG. 12A, reference character T1 denotes a pulse width of a positive or negative voltage, and reference character T2 denotes a pulse interval. The absolute values of the positive and negative voltage are set to be equal. In FIG. 12B, reference characters T1 and T1' denote pulse widths of a positive and negative voltages, respectively, and reference character T2 denotes a pulse interval. The pulse widths are related to each other according to: T1>T1', and the absolute values of the positive and negative voltage are set to be equal.

When an emission current Ie substantially reaches a point of saturation, energization is stopped, the slow leak valve is closed, thereby finishing the activation step.

By this process described above, the electron source substrate having a plurality of surface-conductive electron emitting elements interconnected by matrix wiring is produced.

Then, an example of an image forming device according to the invention which uses the electron source substrate having the simple matrix arrangement described above will be described with reference to FIG. 13.

In FIG. 13, reference numeral 41 denotes an electron source substrate, reference numeral 82 denotes a face plate having a fluorescent film 84, a metal back 85 and the like formed on an inner surface of a glass substrate 83, and reference numeral 86 denotes a supporting frame. The electron source substrate 41, the supporting frame 86 and the face plate 82 are bonded to each other by frit glass and sealed by baking the same at a temperature of 400° C. to 500° C. for 10 minutes or more, thereby forming an envelope 90.

A supporting body (not shown), referred to as spacer, may be disposed between the face plate 82 and the electron source substrate 41, thereby providing the envelope 90 with a sufficient strength to the atmospheric pressure even in the case of a large-area panel.

Figure 14:
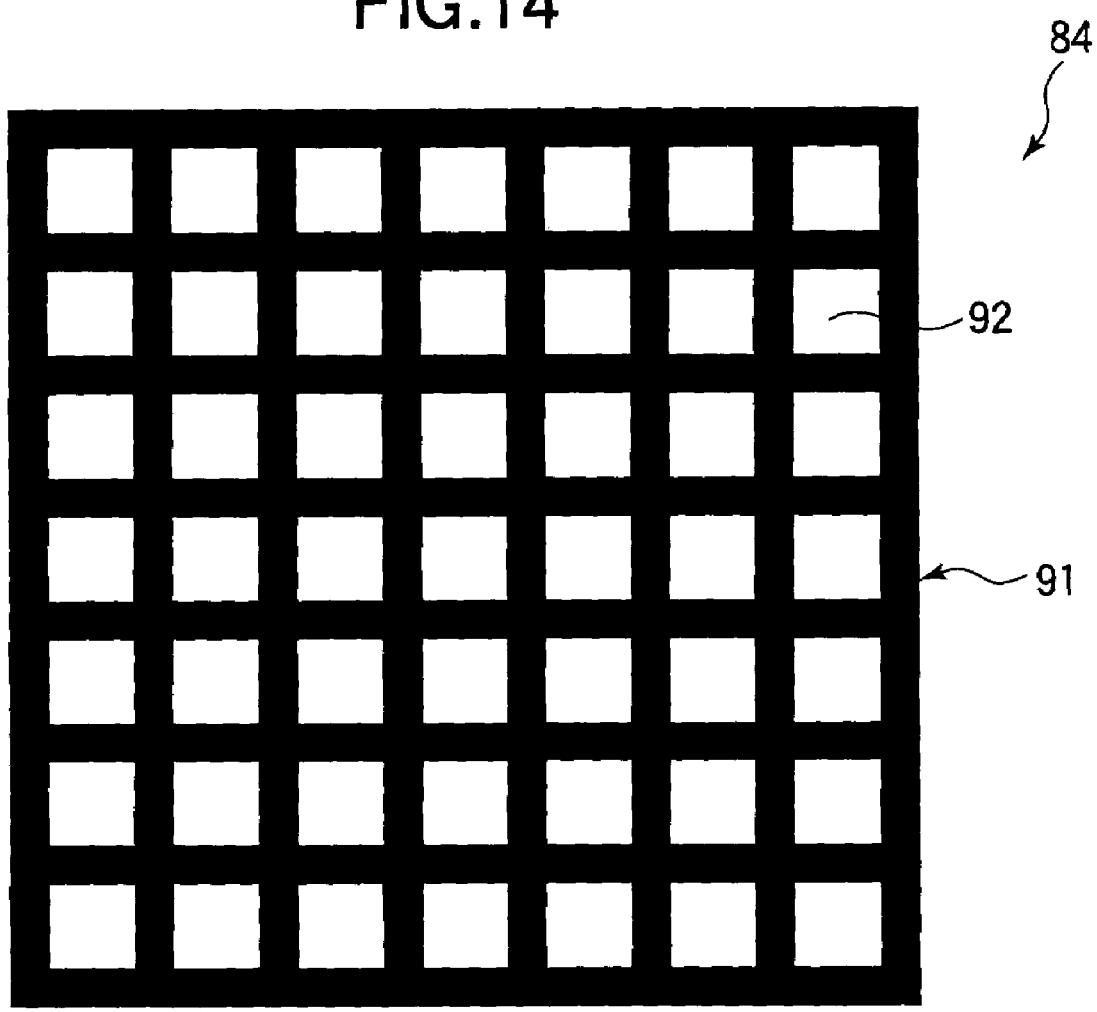
FIG. 14 schematically shows an example of a fluorescent film in the image display device according to the present invention.

FIG. 14 is a diagram for illustrating the fluorescent film 84 on the face plate 82. The fluorescent film 84 is composed only of a fluorescent body in the case of a monochrome fluorescent film, whereas it is composed of a black conductor 91 and fluorescent bodies 92 in the case of a color fluorescent film, the black conductor being referred to as a black strip or black matrix depending on the arrangement of the fluorescent bodies. The black strip or black matrix, which provides a black region between the fluorescent bodies 92 of three primary colors required for color display, is intended for making color mixing or the like less noticeable and for suppressing degradation of contrast due to external light reflection on the fluorescent film 84.

In addition, the metal back 85 is typically provided on the inner surface of the fluorescent film 84. The metal back is intended for mirror-reflecting the light emitted inwardly from the fluorescent bodies toward the face plate 82 to enhance the brightness, for serving as an anode electrode for application of an electron beam accelerating voltage and so on. The metal back can be formed, after formation of the fluorescent film, by performing smoothing (generally referred to as filming) on the inner surface of the fluorescent film and then depositing Al thereon by vacuum evaporation or the like.

In the case of color display, the fluorescent bodies have to be associated with their respective electron emitting elements, and thus, the upper and lower substrates have to be aligned with each other by abutment or the like when performing the sealing described above.

In sealing, the degree of vacuum of the order of $10^{-5}$ Pa is required. And, in order to maintain the degree of vacuum of the sealed envelope 90, gettering may be performed. This is a processing in which, immediately before the envelope 90 is sealed or after the envelope is sealed, a getter placed at a predetermined position (not shown) in the envelope is heated by resistance heating, high-frequency heating or the like to form a deposition film thereof. Generally, the getter primarily contains Ba or the like, and the degree of vacuum is maintained by the adsorption activity or the like of the deposition film.

EXAMPLES

In the following, examples of the invention will be described. However, the invention is not limited to the examples.

Example and Comparative Example

A matrix wiring substrate was fabricated, and an electron source substrate as shown in FIG. 8 was fabricated as described below.

Formation of Element Electrode

On a well-cleaned glass substrate 41, a film of titanium Ti intended for an undercoat layer was deposited to a thickness of 5 nm by sputtering, and a film of platinum Pt was deposited thereon to a thickness of 40 nm by sputtering. Then, a photoresist was applied thereto and patterned in a photolithography process including exposure, development and etching to provide element electrodes 42 and 43 (see FIG. 4). Here, in this example, the interval L between the element electrodes was 10 μm, and the length W of the element electrodes opposing to each other was 100 μm.

(Formation of y-directional Wiring)

Then, y-directional wirings 44 which interconnect the electrodes 43 were formed using a photosensitive conductive paste (FIG. 5). The process of forming the y-directional wirings 44 will be described in detail with reference to FIG. 9.

First, in a deposition step shown in FIG. 9A, a layer 51 was formed on the substrate 41 using the photosensitive conductive paste. The photosensitive conductive paste contained silver as a primary conductive material. Specifically, it contained about 60% to 80% of silver particles and about 20% to 40% of an acrylic monomer having a multiple bond as a photosensitive material, glass frit and a solvent. A film of this photosensitive conductive paste containing the conductive material was deposited on the substrate 41 by screen printing.

A form plate is selected among from those of a roughness of about #150 to #400, depending on the desired final film thickness. In this example, in order for the layer 51 after dried to have a thickness of about 12 µm, a form plate of a roughness of #200 was used.

Then, the photosensitive conductive paste was dried at a temperature of about 80° C. to 150° C. The thickness of the dried layer 51 was about 13 µm.

Then, in an exposure step shown in FIG. 9B, a mask 52 having an opening corresponding to a desired wiring pattern was disposed on the substrate, and the layer 51 of the dried photosensitive conductive paste was exposed to light. Here, the y-directional wiring pattern contained 3840 y-directional wirings having a width of 40 µm at intervals of 160 µm.

In a development step, development was conducted using an alkalescent solution and stopped by rinsing the substrate with pure water, and then the substrate was dried by blowing to provide the y-directional wirings 44 shown in FIG. 9C.

Furthermore, a baking step shown in FIG. 9D was performed. The baking temperature was in the vicinity of 500° C. The thickness of the y-directional wirings 44 after baking was about 7 µm.

In the cross section of each y-directional wiring 44, the minimum thickness of the y-directional wiring 44 was about 7 µm observed at the center thereof (indicated by A in FIG. 9D), and the maximum thickness thereof was about 12 to 14 µm observed at the ends thereof (indicated by B in FIG. 9D).

Furthermore, the maximum width of the y-directional wiring 44 was about 42 µm, and the y-directional wiring 44 had a thickness of about 16 µm at the area in contact with the substrate. Thus, the y-directional wiring 44 having an overhang of a length of 13 µm at each side was provided (see FIG. 9D).

(Formation of Interlayer Insulating Layer)

Then, an interlayer insulating layer 45 was formed using an insulating paste (FIG. 6). Here, reference numeral 49 denotes a contact hole. The photosensitive insulating paste contained $SiO_2$ and lead oxide as primary insulating materials. Specifically, it contained about 60% of glass particles and about 20 to 40% of an acrylic monomer having a multiple bond as a photosensitive material, a polymerization initiator and a solvent.

First, a film of the photosensitive insulating paste was deposited on the substrate 41 by screen printing as in the formation of the y-directional wirings. At this time, a form plate of a roughness of #200 was used, and the thickness of the film after dried was about 21 µm.

FIG. 2 shows a positional relationship between the y-directional wiring and the insulating pattern during the first exposure, development and second exposure steps in this process of forming the interlayer insulating layer. In FIG. 2, reference numeral 11 denotes an exposure mask, reference numeral 12 denotes a layer of the photosensitive insulating paste, reference numeral 12a denotes a region of the photosensitive insulating paste which was cured in the first exposure, and reference numeral 12b denotes a region of the photosensitive insulating paste which was not cured in the first exposure.

The first exposure was conducted by applying light to the substrate from above through the mask 11 having a desired insulating pattern as shown in FIG. 2.

In the development step, development was conducted using an alkalescent solution and stopped by rinsing the substrate with pure water, and then the substrate was dried by blowing to provide the photosensitive insulating pattern in the desired pattern.

Furthermore, the second exposure was performed on the whole surface of the substrate by applying light from the back surface of the substrate without a mask. Taking into account the absorption by the substrate, the quantity of light was set to be enough for the photosensitive insulating material to react.

In the first exposure from above the substrate, light reached to an insufficient depth at a region of the overhang of the y-direction wiring 44, and thus, the photosensitive resin was insufficiently cured. However, by performing the second exposure after development, the resin beneath the overhang could be cured adequately.

After that, baking was conducted at a temperature of about 500° C. Three interlayer insulating layers were stacked in the same manner. However, the second exposure step from the back side of the substrate was not performed on the second and later interlayer insulating layers.

(Formation of x-directional Wiring)

Then, x-directional wirings 46 which interconnect the electrodes 42 were formed using a photosensitive conductive paste (FIG. 7). In this step, 768 x-directional wirings 46 were directly patterned by applying a typical conductive paste to the substrate by screen printing and then fired.

In this way, three substrates each having the XY matrix wirings were produced.

In addition, three XY matrix wiring substrates for comparison were produced in the same manner except that the second exposure from the back side of the substrate was not performed in the process of forming the interlayer insulating layer.

Then, the interlayer insulating layers of the six XY matrix wiring substrates were evaluated in reliability by counting the number of vertical short circuits in the respective XY matrix wiring substrates.

A matrix checker, which checks conductivity by bringing a probe into contact with each of the x-directional and y-directional wirings, was used to count the number of vertical short circuits in the respective substrates. Then, in the matrix wiring substrates fabricated with performing the second exposure from the back side according to the invention, 12, 30 and 9 short circuits, that is, 17 short circuits on average, were observed. On the other hand, in the substrates for comparison fabricated without performing the second exposure from the back side, 97, 52 and 271 vertical short circuits, that is, 140 vertical short circuits on average, were observed. Here, since the number of intersections of the x-directional and y-directional wirings was about 2950 thousands, the probability was at a low level of 0.01% or lower in both cases.

The vertical short circuits in the substrates were observed in more detail. Then, it was proved that, in both fabrication processes, many of the short circuits were caused by the x-directional wiring paste sagging into the pin holes having a size of about 30 μm formed in the interlayer insulating layer at the intersections of the x-directional and y-directional wirings.

That is, the exposure from the back side performed when forming the interlayer insulating layer reduced the probability of occurrence of pin holes to about one-eighth.

With respect to the matrix wiring substrate fabricated in the process according to the invention, a process of fabricating an electron source substrate will be described in detail.

(Formation of Element Film)

The matrix wiring substrate previously fabricated was adequately cleaned, and then, the surface thereof was treated with a solution containing a water repellent to make the surface hydrophobic. This is intended to appropriately spread a solution for forming the element film, which is to be applied later, on the element electrodes. Specifically, an ethyl alcohol solution containing 10 percents by weight of dimethyldiethoxysilane was applied to the substrate by spraying and then dried by hot air at a temperature of 120° C.

Then, the element film 47 was formed between the element electrodes 42 and 43 by ink jet applying. This process will be described with reference to the schematic diagram shown in FIGS. 10A to 10C. Here, in order to compensate for horizontal variations among the element electrodes on the substrate, misalignment of the wiring pattern was observed at several points on the substrate. A misalignment among observation points was corrected by linear approximation, and then the element film forming material was applied to the substrate. Whereby, misalignment of the pixels was eliminated, and the element film forming material was applied to the correct position of the associated pixel.

Figure 10A:
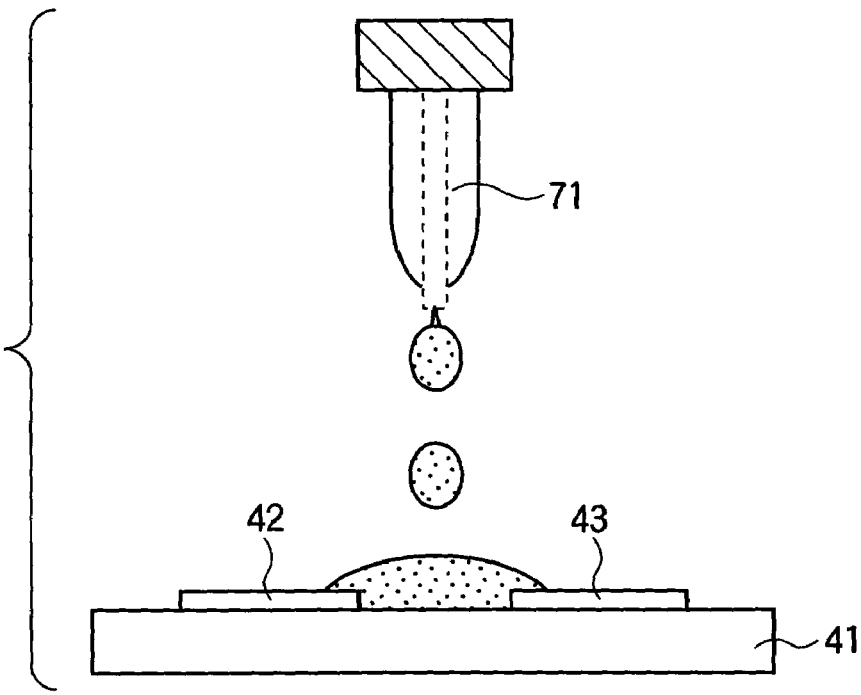
FIGS. 10A, 10B and 10C are diagrams for illustrating a process of manufacturing an electron source substrate.

In this example, in order to provide a palladium film as the element film 47, 0.15 percents by weight of palladium proline complex was dissolved in an aqueous solution containing 85 parts of water and 15 parts of isopropyl alcohol (IPA), thereby providing an organic palladium containing solution. An ink jet injection device using a piezo element, serving as droplet applying means 71, was used to apply a droplet of the solution to the area between the element electrodes by adjusting the device to provide a dot diameter of 60 μm (FIG. 10A).

Figure 10B:
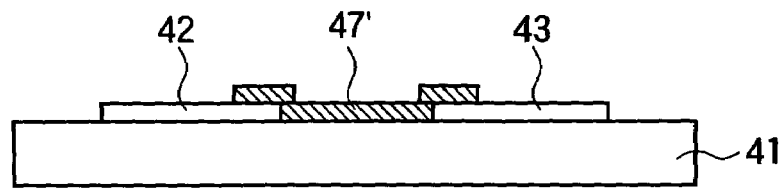
Figure 10C:
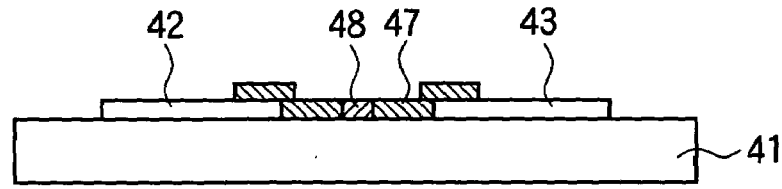

Then, the substrate was heated and fired in air at a temperature of 350° C. for 10 minutes to form an element film 47' made of palladium oxide (PdO) (FIG. 10B). The dot diameter was about 60 μm, and the thickness of the film was 10 nm at the maximum.

(Energization Forming Step)

Then, in this step referred to as an energization forming, the element film 47' was energized to cause a crack therein, thereby forming an electron emitting section.

Specifically, a hood-shaped lid was placed over the whole substrate except for the leading electrodes at the periphery of the substrate, a vacuum was created therein, a voltage was applied across the x-directional wiring and y-directional wiring from an external power supply via the electrode terminals to flow a current between the element electrodes, thereby partially breaking, deforming or modifying the element film 47' to form an electron emitting section 48 which has a high electric resistance.

At this time, if the substrate is heated by energization in a vacuum atmosphere containing a small amount of hydrogen gas, hydrogen promotes reduction to change the element film 47' made of palladium oxide PdO into the element film 47 made of palladium Pd.

In this change, since the film is reduced to be shrunk, a crack (clearance) occurs in a part of the film. The position where the crack occurs and the shape thereof largely depend on the uniformity of the original film. To reduce characteristic variations among a large number of elements, above all, it is desirable that the crack occurs at the center of the element film 47 and has a linear shape.

While electron emission occurs, under a predetermined voltage, in the vicinity of the crack provided in this energization forming step, the electron emission efficiency is extremely low in this state.

The resistance Rs of the element film 47 ranges from $10^2$ to $10^7$ Ω.

In this example, a pulse waveform shown in FIG. 11B was used in the forming step, and T1 was set at 0.1 ms and T2 was set at 50 ms. The applied voltage was increased from 0.1 V in increments of 0.1 V every 5 seconds. Energizing forming was finished when the resistance value determined from the measurement of the current flowing through the element during pulse voltage application became 1000 or more times the resistance before the forming step.

(Activation Step)

The activation is conducted by placing a hood-shaped lid over the substrate as in the forming step described above, creating a vacuum therein, and repeatedly applying a pulse voltage across the element electrodes from the outside via the x-directional and y-directional wirings. Then, a gas containing carbon atoms is introduced, and carbon or carbon compound derived therefrom is deposited as a carbon film in the vicinity of the crack.

In this example, tolunitrile was used as a carbon source and was introduced into the vacuum space through a slow leak valve, and the vacuum space was maintained at a pressure of $1.3 \times 10^{-4}$ Pa.

FIGS. 12A and 12B show preferred examples of voltage application in the activation step. The maximum value of the applied voltage is appropriately selected from a range of 10 V to 20 V.

In FIG. 12A, reference character T1 denotes a pulse width of a positive or negative voltage, and reference character T2 denotes a pulse interval. The absolute values of the positive and negative voltage are set to be equal. In FIG. 12B, reference characters T1 and T1' denote pulse widths of a positive and negative voltages, respectively, and reference character T2 denotes a pulse interval. The pulse widths are related to each other according to: T1>T1', and the absolute values of the positive and negative voltage are set to be equal.

At this time, the voltage applied to the element electrode 3 was assumed to be positive, and the direction of an element current if flowing from the element electrode 3 to the element electrode 2 was assumed to be positive. After about 60 minutes, when an emission current Ie substantially reaches a point of saturation, energization was stopped, the slow leak valve was closed, thereby finishing the activation step.

By this process described above, the electron source substrate having a large number of surface-conductive electron emitting elements interconnected by matrix wiring was produced.

(Characteristics Evaluation of Electron Source Substrate)

The electron emitting characteristic of the electron source substrate having the element arrangement described above and fabricated in the fabrication method described above was measured. As a result, the measured emission current Ie at the time when a voltage of 12 V was applied across the element electrodes was 0.6 μA on average, and the electron emission efficiency was 0.15% on average. The uniformity among the elements was also good, and variations of the emission current Ie among the elements was 5%, which was a good result.

Then, using the electron source substrate having the simple matrix arrangement fabricated as described above, an image display device (display panel) as shown in FIG. 13 was manufactured. Here, in FIG. 13, in order to show the inside of the device, the device is shown by being partially cut away.

In this example, the electron source substrate 41, the supporting frame 86 and the face plate 82 were bonded to each other by frit glass and sealed by baking the same at a temperature of 480° C. for 30 minutes, thereby forming the envelope 90.

Since this sequential process was conducted entirely in a vacuum chamber, a vacuum could be created in the envelope 90 at the same time, and therefore, the whole process could be simplified.

The display panel shown in FIG. 13 was fabricated in this manner, and a driving circuit consisting of a scan circuit, a control circuit, a modulation circuit, and direct-current voltage source and the like was connected thereto, whereby the panel-like image display device was manufactured.

In the image display device manufactured as described above, an image was displayed by applying a voltage to each electron emitting element via the x-directional and y-directional terminals to cause the electron emitting element to emit electrons, and applying a high voltage to the metal back 85, which serves as an anode electrode, via the high voltage terminal Hv, thereby accelerating the generated electron beam and causing the same to collide with the fluorescent film 84.

The image display device according to this example was superior in electrical reliability of the x-directional and y-directional wirings, and therefore, had a high image quality.

As described above, according to the invention, there can be provided a method of forming a reliable member pattern having an insulation performance or conductivity.

In addition, the invention can provide a method of forming a member pattern in which occurrence of a pin hole can be suppressed.

In addition, the invention can provide a method of forming a member pattern capable of providing good contact between paired conductive members.

In addition, the invention can provide a method of fabricating a highly reliable wiring structure in which occurrence of a pin hole in an interlayer insulating layer is suppressed and short circuit between upper and lower wirings is few in number, a method of fabricating an electron source using the same, and a method of manufacturing an image display device using the same.

What is claimed is:

1. A method of manufacturing a member pattern having a patterned member on a substrate, comprising:
   a first exposure step of exposing a desired region of a negative type photosensitive material applied to the substrate to light from a first direction;
   a second exposure step of exposing the desired region of the negative type photosensitive material to light from a second direction opposite to said first direction;
   a development step of performing development after said exposure steps to form a precursor pattern of said member; and
   a step of baking said precursor pattern,
   wherein said negative type photosensitive material is applied to extend over a member previously disposed on said substrate and said substrate.

2. The method of manufacturing a member pattern according to claim 1, wherein the member previously disposed on said substrate has a higher optical reflectance than said substrate.

3. The method of manufacturing a member pattern according to claim 1, wherein the member previously disposed on said substrate is a member that is formed in a process involving exposure, development and baking of a photosensitive material.

4. The method of manufacturing a member pattern according to claim 1, wherein the member previously disposed on said substrate has an overhanging part in the cross section thereof.

5. The method of manufacturing a member pattern according to claim 1, wherein said patterned member is an insulating member, and said insulating member has a contact hole for electrically interconnecting paired conductive members stacked on said substrate with the insulating member interposed therebetween.

6. A method of manufacturing a member pattern having a patterned member on a substrate, comprising:
   a first exposure step of exposing a desired region of a negative type photosensitive material applied to the substrate to light from a first direction;
   a development step of performing development after said first exposure step to form a precursor pattern of said member;
   a second exposure step of exposing the precursor pattern of said member to light from a second direction opposite to said first direction; and
   a step of baking said precursor pattern after said second exposure step.

7. The method of manufacturing a member pattern according to claim 6, wherein said negative type photosensitive material is applied to extend over a member previously disposed on said substrate and said substrate.

8. The method of manufacturing a member pattern according to claim 7, wherein the member previously disposed on said substrate has a higher optical reflectance than said substrate.

9. The method of manufacturing a member pattern according to claim 7, wherein the member previously disposed on said substrate is a member that is formed in a process involving exposure, development and baking of a photosensitive material.

10. The method of manufacturing a member pattern according to claim 7, wherein the member previously disposed on said substrate has an overhanging part in the cross section thereof.

11. The method of manufacturing a member pattern according to claim 6, wherein said patterned member is an insulating member, and said insulating member has a contact hole for electrically interconnecting paired conductive members stacked on said substrate with the insulating member interposed therebetween.

12. A method of manufacturing a wiring structure having, on a substrate, a first wiring and a second wiring intersecting said first wiring and disposed over the first wiring through an insulator,
   wherein a process of forming said insulator comprises: a first exposure step of exposing a desired region of a negative type photosensitive insulating material to light from a first direction, the negative type photosensitive insulating material being applied to extend over said substrate and the first wiring disposed on the substrate; a second exposure step of exposing the desired region of the negative type photosensitive insulating material to light from a second direction opposite to said first direction; a step of performing development after said exposure steps to form a precursor pattern of said insulator; and a step of baking the precursor pattern of said insulator.

13. The method of manufacturing a wiring structure according to claim 12, wherein said first wiring is a member which has a higher optical reflectance than said substrate.

14. The method of manufacturing a wiring structure according to claim 12, wherein said first wiring is a member that is formed in a process involving exposure, development and baking of a photosensitive material.

15. The method of manufacturing a wiring structure according to claim 12, wherein said first wiring has an overhanging part in the cross section thereof.

16. The method of manufacturing a wiring structure according to claim 12, wherein said insulator has a contact hole for electrically interconnecting paired conductive members stacked on said substrate with the insulator interposed therebetween.

17. A method of manufacturing an electron source having a wiring structure and an electron emitting element connected to said wiring structure, the wiring structure having, on a substrate, a first wiring and a second wiring intersecting said first wiring and disposed over the first wiring through an insulator, wherein said wiring structure is manufactured according to the method in claim 12.

18. A method of manufacturing an image display device having a wiring structure, an electron emitting element connected to said wiring structure and an image display member for displaying an image by irradiation with electrons from said electron emitting element, the wiring structure having, on a substrate, a first wiring and a second wiring intersecting said first wiring and disposed over the first wiring through an insulator, wherein said wiring structure is manufactured according to the method in claim 12.

19. A method of manufacturing a wiring structure having, on a substrate, a first wiring and a second wiring intersecting said first wiring and disposed over the first wiring through an insulator, wherein a process of forming said insulator comprises: a first exposure step of exposing a desired region of a negative type photosensitive insulating material to light from a first direction, the negative type photosensitive insulating material being applied to extend over said substrate and the first wiring disposed on the substrate; a step of performing development after said first exposure step to form a precursor pattern of said insulator; a second exposure step of exposing the precursor pattern of said insulator to light from a second direction opposite to said first direction; and a step of baking the precursor pattern after said second exposure step.

20. The method of manufacturing a wiring structure according to claim 19, wherein said first wiring is a member which has a higher optical reflectance than said substrate.

21. The method of manufacturing a wiring structure according to claim 19, wherein said first wiring is a member that is formed in a process involving exposure, development and baking of a photosensitive material.

22. The method of manufacturing a wiring structure according to claim 19, wherein said first wiring has an overhanging part in the cross section thereof.

23. The method of manufacturing a wiring structure according to claim 19, wherein said insulator has a contact hole for electrically interconnecting paired conductive members stacked on said substrate with the insulator interposed therebetween.

24. A method of manufacturing an electron source having a wiring structure and an electron emitting element connected to said wiring structure, the wiring structure having, on a substrate, a first wiring and a second wiring intersecting said first wiring and disposed over the first wiring through an insulator, wherein said wiring structure is manufactured according to the method in claim 19.

25. A method of manufacturing an image display device having a wiring structure, an electron emitting element connected to said wiring structure and an image display member for displaying an image by irradiation with electrons from said electron emitting element, the wiring structure having, on a substrate, a first wiring and a second wiring intersecting said first wiring and disposed over the first wiring through an insulator, wherein said wiring structure is manufactured in the method according to claim 19.

* * * * *

UNITED STATES PATENT AND TRADEMARK OFFICE
CERTIFICATE OF CORRECTION

| | |
|---|---|
| PATENT NO. | : 7,067,236 B2 |
| APPLICATION NO. | : 10/619575 |
| DATED | : June 27, 2006 |
| INVENTOR(S) | : Shuji Yamada et al. |

It is certified that error appears in the above-identified patent and that said Letters Patent is hereby corrected as shown below:

COLUMN 1

Line 15, "pattern" should read --pattern,--

COLUMN 4

Line 66, "to extent" should read --to extend--

COLUMN 9

Line 20, "photosensitive" should read --photosensitive insulating material--
Line 24, "after pat-" should read --after being pat--
Line 27, "percents" should read --percent--
Line 32, "after dried." should read --after being dried.--
Line 55, "after dried," should read --after being dried,--
Line 56, "percents" should read --percent--

COLUMN 10

Line 5, "after baked" should read --after being baked--
Line 5, "before baked" should read --before being baked--
Line 42, "are formed." should read --is formed.--
Line 53, "for maintain" should read --for maintaining--
Line 58, "is formed" should read --and is formed--

COLUMN 12

Line 45, "11B particularly" should read --11B. Particularly--

COLUMN 13

Line 63, "spacer," should read --a spacer,--

COLUMN 15

Line 14, "among from" should read --from among--
Line 17, "dried" should read --being dried--
Line 60, "dried" should read --being dried--

UNITED STATES PATENT AND TRADEMARK OFFICE
CERTIFICATE OF CORRECTION

PATENT NO. : 7,067,236 B2
APPLICATION NO. : 10/619575
DATED : June 27, 2006
INVENTOR(S) : Shuji Yamada et al.

It is certified that error appears in the above-identified patent and that said Letters Patent is hereby corrected as shown below:

<u>COLUMN 17</u>

Line 18, "percents" should read --percent--
    Line 23, "ink jet applying." should read --applying ink jet--
    Line 31, "Whereby," should read --Thereby,--
    Line 36, "percents" should read --percent--

<u>COLUMN 18</u>

Line 45, "voltages," should read --voltage,--

Signed and Sealed this

Sixth Day of March, 2007

JON W. DUDAS
*Director of the United States Patent and Trademark Office*